US009496881B2

United States Patent
Zhao et al.

(10) Patent No.: US 9,496,881 B2
(45) Date of Patent: Nov. 15, 2016

(54) PLL AND ADAPTIVE COMPENSATION METHOD IN PLL

(71) Applicant: Telefonaktiebolaget LM Ericsson (publ), Stockholm (SE)

(72) Inventors: Zhongyuan Zhao, Chengdu (CN); Weixu Wang, Chengdu (CN); Luping Pan, Chengdu (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/021,867

(22) PCT Filed: Sep. 22, 2013

(86) PCT No.: PCT/CN2013/083898
§ 371 (c)(1),
(2) Date: Mar. 14, 2016

(87) PCT Pub. No.: WO2015/039330
PCT Pub. Date: Mar. 26, 2015

(65) Prior Publication Data
US 2016/0226500 A1   Aug. 4, 2016

(51) Int. Cl.
*H03L 7/06* (2006.01)
*H03L 7/093* (2006.01)
*H03G 3/20* (2006.01)
*G01P 15/097* (2006.01)

(52) U.S. Cl.
CPC ............ *H03L 7/093* (2013.01); *G01P 15/097* (2013.01); *H03G 3/20* (2013.01)

(58) Field of Classification Search
USPC .................................. 327/147–149, 156–158
See application file for complete search history.

(56) References Cited

U.S. PATENT DOCUMENTS

| 4,451,755 | A | | 5/1984 | Vig et al. |
|---|---|---|---|---|
| 4,891,611 | A | | 1/1990 | Frerking |
| 5,659,271 | A | * | 8/1997 | Tanabe ..................... H03L 7/08 331/10 |
| 5,786,735 | A | | 7/1998 | Su |

(Continued)

FOREIGN PATENT DOCUMENTS

| CN | 1696717 A | 11/2005 |
|---|---|---|
| CN | 103297366 A | 9/2013 |

(Continued)

OTHER PUBLICATIONS

Author Unknown, "Clock Division with Jitter and Phase Noise Measurements," Revision 1.0, Date Unknown, Silicon Laboratories, Inc., pp. 1-12.

(Continued)

*Primary Examiner* — Adam Houston
(74) *Attorney, Agent, or Firm* — Withrow & Terranova, PLLC

(57) ABSTRACT

In a method for mitigating the vibration-induced phase noise of an phase locked loop with an acceleration sensitive voltage controlled oscillator, a correction signal generated by applying a gain and a equalization to an acceleration signal provided by an acceleration sensor sensing the acceleration on the VCO, is added to the oscillator control signal for active compensation, an adaptive compensation unit dynamically adjusts the gain, the frequency response of equalization, and the sensing direction of the acceleration sensor while the phase locked loop is working to make the active compensation automatically adapt to the parameters of the voltage controlled oscillator.

17 Claims, 10 Drawing Sheets

(56) References Cited

U.S. PATENT DOCUMENTS

| | | | |
|---|---|---|---|
| 6,816,019 B2* | 11/2004 | Delbo' | H03L 7/0891 |
| | | | 327/156 |
| 7,358,820 B2 | 4/2008 | Da Dalt | |
| 8,390,388 B1 | 3/2013 | Hoffmann et al. | |
| 2002/0136342 A1* | 9/2002 | Lee | H03L 7/087 |
| | | | 375/376 |
| 2006/0176599 A1 | 8/2006 | Semba | |
| 2012/0043999 A1* | 2/2012 | Quevy | H03L 1/022 |
| | | | 327/147 |
| 2012/0161834 A1* | 6/2012 | Lee | H03L 1/00 |
| | | | 327/156 |
| 2012/0223785 A1 | 9/2012 | Fry et al. | |
| 2015/0188527 A1* | 7/2015 | Francom | H03K 5/14 |
| | | | 327/158 |

FOREIGN PATENT DOCUMENTS

| | | |
|---|---|---|
| GB | 2439606 A | 1/2008 |
| JP | 2001156633 A | 6/2001 |
| WO | 03100876 A2 | 12/2003 |

OTHER PUBLICATIONS

Author Unknown, "VCXO Tuning Slope (Kv), Stability, and Absolute Pull Range (APR)," AN266, Revision 0.2, Oct. 2010, Silicon Laboratories, Inc., 8 pages.

Ernst, Gregory, et al., "Reducing Phase Noise Degradation Due to Mechanical Vibration on High Performance Quartz Resonator Oscillators for Gateway Applications," IEEE International Frequency Control Symposium, May 19-21, 2008, Honolulu, Hawaii, IEEE, 6 pages.

Filler, Raymond L., "The Acceleration Sensitivity of Quartz Crystal Oscillators: A Review," 41st Annual Frequency Control Symposium, May 27-29, 1987, Philadelphia, Pennsylvania, USA, IEEE, pp. 398-408.

Fry, Steve, "Acceleration Sensitivity Characteristics of Quartz Crystal Oscillators," App Note, Jan. 2006, Greenray Industries, Inc., 6 pages.

Gagnepain, J.J., et al., "Chapter 5: Nonlinear Effects in Piezoelectric Quartz Crystals," Physical Acoustics, vol. 11, 1975, Elsevier, pp. 245-288.

Haskell, R. B., et al., "High Q, Precision SC Cut Resonators with Low Acceleration Sensitivity," IEEE International Fequency Control Symposium and PDA Exhibition, 2002, IEEE, 8 pages.

Morley, P.E., et al., "Method for measurement of the sensitivity of crystal resonators to repetitive stimuli," IEEE International Frequency Control Symposium and PDA Exhibition, 2002, IEEE, 5 pages.

Rosati, Vincent, J., et al., "Suppression of Vibration-Induced Phase Noise in Crystal Oscillators: An Update," 41st Annual Symposium on Frequency Control, May 27-29, 1987, Philadelphia, Pennsylvania, USA, IEEE, pp. 409-412.

Rosati, Vincent, R., et al., "Reduction of the Effects of Vibration on SC-Cut Quartz Crystal Oscillators," Proceedings of the 35th Annual Frequency Control Symposium, USERADCOM, May 27-29, 1981, Fort Monmouth, New Jersey, IEEE, pp. 117-121.

Walls, Fred L., et al., "Environmental Sensitivities of Quartz Oscillators," IEEE Transactions on Ultrasonics, Ferroelectrics, and Frequency Control, vol. 39, Issue 2, Mar. 1992, IEEE, pp. 241-249.

Yonggao, Zhu, "Jitter Attenuator of PI6CX201A Loop Filter Design," Application Note 334, Jan. 11, 2012, Pericom Semiconductor Corp., pp. 1-7.

International Search Report and Written Opinion for International Patent Application No. PCT/CN2013/083898, mailed Jul. 1, 2014, 13 pages.

International Preliminary Report on Patentability for International Patent Application No. PCT/CN2013/083898, mailed Mar. 31, 2016, 7 pages.

* cited by examiner

PLL AND ADAPTIVE COMPENSATION METHOD IN PLL

This application is a 35 U.S.C. §371 national phase filing of International Application No. PCT/CN2013/083898, filed Sep. 22, 2013, the disclosure of which is incorporated herein by reference in its entirety.

TECHNICAL FIELD

The present disclosure relates to a field of electronic circuits, and particularly to a phase locked loop (PLL), an apparatus comprising the PLL, and an adaptive compensation method in the PLL.

BACKGROUND

Crystals, such as quartz crystal oscillator, are widely used in frequency sources of electronic circuits, such as jitter cleaner and frequency synthesizer. However, it is also well known that the natural resonant frequency of such crystals changes when the crystals are subjected to acceleration (cf. Reference [1]). Due to the acceleration sensitivity of crystal oscillator, mechanical vibration could induce additional phase noise to its output clock which can unfavorably cause performance degradation or even malfunction to numerous applications.

The vibration effect is obvious in three typical real-world scenarios: 1) a wireless base station on an iron tower shaken by wind, passing trucks or earthquakes; 2) vehicle-carried equipments, such as wireless communication terminals, radar, navigator and/or scientific instrument on cars, trains, ships, airplane, helicopter, rockets, or space shuttle; and 3) high-speed network/digital communication equipments, e.g. high-speed gateway applications, high speed routers, high-throughput cloud storage equipments. These equipments require a system clock with ultra low phase noise which may be degraded by vibrations from cooling fans or human operations (walking, closing doors).

Considering that the PLL is a fundamental module widely used in electronic devices, vibration-induced phase noise may degrade key performances of electronic systems, e. g. connectivity, signal/noise ratio and/or bit error rate of communication system, the resolution and/or reliability of radar and other sensors. Therefore, a technology to suppress the vibration-induced phase noise is very valuable to many markets such as cellular networks, smart-phones, 2-way radios, vehicle-to-vehicle communication, radar, aerospace, internet and/or cloud facilities, and etc.

The well-known methods for reducing the acceleration sensitivity of crystal oscillator include both active and passive methods.

The passive approach involves either a special mechanical structure to absorb vibration or mounting pairs of oppositely oriented crystals to cancel the acceleration-induced frequency shifts. Such methods have been applied in both print circuit board (PCB) level (cf. Reference [2]) or micro structure integrated in compact sized packages (cf. References [3]-[7]).

In the active method, mechanical vibration may be sensed by acceleration sensors and fed back to dynamically adjust an output frequency of the crystal oscillator through its tuning interface. There are usually three accelerometers closely placed to the crystal oscillator to sense the accelerations of 3 axes in free space.

In 1981 (cf. Reference [8]) and 1987 (cf. Reference [9]), V. R. Rosati et al. proposed a solution in which the tuning signal generated by the accelerometer may be modified by an analog amplifier with a fixed gain and no phase delay.

In 1989 (cf. Reference [10]), Frerking described using an adaptive filter in a polarization-effect tuning method to minimize a voltage controlled crystal oscillator's (VCXO) vibration-induced phase noise.

In 1997 (cf. Reference [11]), Wei proposed an adaptive signal conditioner comprising one or more accelerometers, a bandpass filter and an analog circuit representing transfer function H(s) to suppress the vibration-induced phase noise of the VCXO.

In 2006 (cf. Reference [20]), Nicola et al. proposed a device for stabilizing the PLL. In Nicola's patent, the stabilizing device may add a random digital signal to the oscillator control signal and cross-correlates an output of a phase detector and said random digital signal to estimate a transfer function and a loop gain of the PLL. The estimated transfer function and loop gain may be then used to adjust the gain of two amplifiers through a lookup table to stabilize the transfer function of PLL when the jitter of reference clock changes. In Nicola's patent, the variance and gain of the signal added into the oscillator control signal are pre-determined, and the loop filter is adjusted. It is only be applicable to all digital PLL and not aims to suppress the vibration induced phase noise.

Existing passive and active methods suffer certain drawbacks which either limit its performance or bring high product costs.

Therefore, a technical solution of adaptively compensating vibration in the PLL is desired.

SUMMARY

Embodiments of the present disclosure provide a mechanism for mitigating the vibration-induced phase noise of acceleration sensitive voltage controlled oscillator (VCO) in phase locked loop (PLL). The mechanism in some embodiments comprises an active compensation approach in which a compensation network, by applying an attenuation to an acceleration signal sensed by an acceleration sensor closely placed to the VCO, generates a correction signal, which is added to the oscillator control signal for mitigating the vibration-induced phase noise. The mechanism in some embodiments further comprises methods for dynamically adjusting the parameters of the compensation network, such as the gain (attenuation), so that the compensation network can dynamically adapt to individual VCO sample while working, where the parameters of each VCO sample, such as sensitivity and acceleration sensitivity, are usually different and may vary with its working frequency, environmental temperature, aging, etc. Furthermore, with the adaptive active compensation network, the pre-calibration or pre-configuration for the compensation network, which is necessary in existing active compensation approaches, may no longer required in some embodiments of the present disclosure.

According to an aspect of the present disclosure, a phase locked loop (PLL) is provided. The PLL comprises a phase frequency detector (PFD), a loop filter, and a voltage controlled oscillator (VCO). The PLL further comprises: an acceleration sensor for generating an acceleration signal by detecting an acceleration of the VCO; a first filter for filtering a phase difference signal generated by the PFD to obtain a filtered phase difference signal; an adaptive compensation unit for generating a correction signal based on the acceleration signal and the filtered phase difference signal; a first summing unit, connected between the loop filter and the VCO, for summing up the correction signal and an oscillator control signal output from the loop filter to compensate a frequency shift of an output clock signal from the VCO caused by the acceleration of the VCO.

Preferably, the adaptive compensation unit comprises: a cross-correlation unit for calculating a correlation coefficient between the acceleration signal and the filtered phase difference signal; a gain generation unit for generating a gain setting signal as a gain for the acceleration signal based on the correlation coefficient; and a first variable gain amplifier (VGA) for generating the correction signal by applying the gain to the acceleration signal.

Preferably, the acceleration sensor comprises: a plurality of accelerometers, each being configured for generating an acceleration component signal by detecting an acceleration component of the VCO in one of a plurality of directions; a plurality of VGAs, each being connected to a respective output of the plurality of accelerometers for applying a respective weight to a corresponding acceleration component signal to get a weighted acceleration component signal; and a second summing unit configured for summing up the weighted acceleration component signals to form the acceleration signal.

Preferably, the adaptive compensation unit further comprises: a de-multiplexer for forwarding the gain setting signal from the gain generation unit to a selected one of the first VGA as the gain and to the plurality of VGAs as the weights.

The weights for the plurality of VGAs are determined by:
a) judging whether current weights are marked as calibrated;
b) initially setting one of the gain and the weights to be a non-zero constant, and the other(s) of the gain and the weights to be zero, if it is judged that any one of the current weights is not marked as calibrated;
c) sequentially repeating an iteration as follows on each of the VGAs of which the gain or the weight is initialized to be zero in b), until all of at least one of the gain or weights are determined:
   forwarding the gain setting signal from the gain generation unit to the selected one of the VGAs, meanwhile holding the gain or weight of each of the rest VGAs as its value being determined by the previous iteration;
   letting the PLL work for continually updating the gain or weight of the selected VGA until the gain or weight of the selected VGA is converged to a certain value which is then determined as the gain or weight of the selected VGA in the current iteration;
d) deciding whether the at least one of the gain or weights determined in c) are converged by judging whether the variances of respective time series of the gain and weights determined by arbitrary number of recent iteration(s) performed in c) are smaller than a predetermined threshold;
e) repeating c)-d), until it is decided that the at least one of the current determined gain or weights are converged; and
f) marking the current determined weights as calibrated.

Preferably, the cross-correlation unit is configured for obtaining a peak value and its position in a cross-correlation sequence calculated from sequences of the acceleration signal and the filtered phase difference signal as the correlation coefficient and a delay respectively.

Preferably, the adaptive compensation unit further comprises: a second filter arranged between the acceleration sensor and the first VGA, and configured for equalizing the acceleration signal from the acceleration sensor with its filter coefficients; and an equalization coefficient estimator for updating the filter coefficients of the second filter based on the delay, the acceleration signal and the filtered phase difference signal.

Alternatively, the adaptive compensation unit further comprises: a second filter arranged between the first VGA and the first summing unit, and configured for filtering the correction signal from the first VGA with its filter coefficients; and an equalization coefficient estimator for updating the filter coefficients of the second filter based on the delay, the acceleration signal and the filtered phase difference signal.

According to another aspect of the present disclosure, a PLL is provided. The PLL comprises a phase frequency detector (PFD), a loop filter, and a voltage controlled oscillator (VCO). The PLL further comprises: a plurality of accelerometers, each being configured for generating an acceleration component signal by detecting an acceleration component of the VCO in one of a plurality of directions; a first filter configured for filtering a phase difference signal generated by the PFD to obtain a filtered phase difference signal; a plurality of adaptive compensation units, each being configured for generating a correction component signal based on the corresponding acceleration component signal and the filtered phase difference signal; a second summing unit configured for summing up the correction component signals to form a correction signal; a first summing unit, connected between the loop filter and the VCO, for summing up the correction signal and an oscillator control signal output from the loop filter to compensate a frequency shift of an output clock signal from the VCO caused by the acceleration of the VCO.

Preferably, each of the adaptive compensation units comprises: a cross-correlation unit for calculating a correlation coefficient between the acceleration component signal and the filtered phase difference signal; a gain generation unit for generating a gain setting signal as a gain for the acceleration component signal based on the correlation coefficient; and a variable gain amplifier (VGA) for generating the correction component signal by applying the gain to the acceleration component signal.

According to an aspect of the present disclosure, an apparatus comprising the PLL above is provided.

According to another aspect of the present disclosure, a method for adaptively compensating a phase locked loop (PLL) is provided. The method comprise: generating an acceleration signal by detecting an acceleration of a voltage controlled oscillator VCO of the PLL; generating a correction signal by applying a gain to the acceleration signal; and summing up the correction signal and an oscillator control signal from a loop filter of the PLL for compensating a frequency shift of an output clock signal from the VCO caused by the acceleration of the VCO.

Preferably, the gain may be obtained by steps of: obtaining a feedback clock signal; determining a phase difference signal between a reference clock signal and the feedback clock signal; filtering the phase difference signal to obtain the filtered phase difference signal; calculating a correlation coefficient of the acceleration signal and the filtered phase difference signal; and generating a gain setting signal as the gain based on the correlation coefficient.

Preferably, generating the acceleration signal comprises: generating a plurality of acceleration component signals, each being generated by detecting an acceleration component in each of a plurality of directions; applying a respective weight to a corresponding acceleration component signal to get a weighted acceleration component signal; and summing up the weighted acceleration component signals to form the acceleration signal.

Preferably, the weights are determined by:
a) judging whether current weights are marked as calibrated;
b) initially setting one of the gain and the weights to be a non-zero constant, and the other(s) of the gain and the weights to be zero, if it is judged that any one of the current weights is not marked as calibrated;
c) sequentially repeating an iteration as follows on the acceleration signal or the acceleration component signal to which the gain or the weight initialized to be zero in b) is applied, until all of at least one of the gain or weights are determined:
   applying the gain setting signal to a selected one of the acceleration signal and the acceleration component signal, meanwhile holding the applied gain or weights as their values being determined by the previous iteration;
   letting the PLL work for continually updating the gain applied to the selected acceleration signal or the weight applied to the selected acceleration component signal, until the gain applied to the selected acceleration signal or the weight applied to the selected acceleration component signal is converged to a certain value which is then determined as the gain applied to the selected acceleration signal or the weight applied to the selected acceleration component signal in the current iteration;
d) deciding whether the at least one of the gain or weights determined in c) are converged by judging whether the variances of the respective time series of the gain and weights determined by arbitrary number of recent iteration(s) performed in Step c) are smaller than a predetermined threshold;
e) repeating c)-d), until it is decided that the at least one of the current determined gain or weights are converged; and
f) marking the current determined weights as calibrated.

Preferably, calculating the correlation coefficient comprises: obtaining a peak value and its position in a cross-correlation sequence calculated from sequences of the acceleration signal and the filtered phase difference signal as the correlation coefficient and a delay respectively.

Preferably, the method further comprises: updating filter coefficients of a filter based on the delay, the acceleration signal and the filtered phase difference signal; and filtering the acceleration signal with the updated filter coefficients.

Alternatively, the method further comprises: updating filter coefficients of a filter based on the delay, the acceleration signal and the filtered phase difference signal; and filtering the correction signal with the updated filter coefficients.

The present disclosure may keep some advantages of active compensation approaches, such as, compact size, low weight, no need of additional mechanical resonance, and no need of special assembly line or manufacturing art. Meanwhile, the present disclosure has better compensation accuracy and adaptivity, and may reduce the cost by eliminating cumbersome and costy pre-calibration and/or pre-configuration operations.

BRIEF DESCRIPTION OF THE DRAWINGS

The objects, advantages and characteristics of the present disclosure will be more apparent, according to descriptions of preferred embodiments in connection with the drawings, wherein.

It should be noted that various parts in the drawings are only for an illustrative purpose, and thus should not be understood as any limitations and constraints on the scope of the present disclosure. In the drawings, similar reference numbers refer to similar parts unless otherwise specified.

DETAILED DESCRIPTION

One major drawback of vibration isolation is severely performance degradation at one or more mechanical resonation frequencies. Another one is its significantly increased size and weight which may limit its application in handset, compact or vehicle-carried devices.

For paired mounting technology, the compensation performance depends on how well the crystal oscillator pair(s) matches. Because of the variance of acceleration sensitivity of individual samples of the same batch is about 20% to 30% (cf. References [12]-[14]), the compensation ratio of randomly paired crystal oscillators is about 5:1 or 3:1. For well-matched crystal oscillator pair, the compensation ratio is much higher in the cost of expensive measurement and selection of samples, especially when 8 identical samples are required for 3-axes compensation. In a word, the paired mounting technology suffers either poor performance or high product cost.

Besides limitations in performance and/or cost, many passive methods implemented by micro mechanics or micro-structure require special manufacturing technology and/or dedicated assembly line in manufacture which further drive up the cost of product.

Active methods using only one ordinary crystal oscillator can typically achieve a compensation ratio of 10:1 without significantly increasing size and weight of the circuit. However, there are two major drawbacks in current active compensation methods: 1) poor adaptivity, and 2) cumbersome pre-calibration and/or pre-configuration.

In current active methods, the feedback network may be calibrated and/or configured during manufacturing and fixed for the rest lifetime of products. However, because the parameters (acceleration sensitivity, tuning sensitivity, linearity) of the crystal oscillators may also be subjected to the working frequency (cf. References [15]-[16]), environmental temperature and aging status (cf. Reference [17]). Fixed feedback network calibrated for a specific working frequency performs poorly in different working frequencies, environmental temperatures, and/or aging status. The poor adaptivity limits the application of the active methods and/or requires additional solutions.

Moreover, in the active compensation methods, the pre-calibration or pre-configuration of the feedback network requires expensive testing equipments and numerous human efforts which significantly lower the efficiency and increase the cost of manufacturing.

Figures 1, 2:
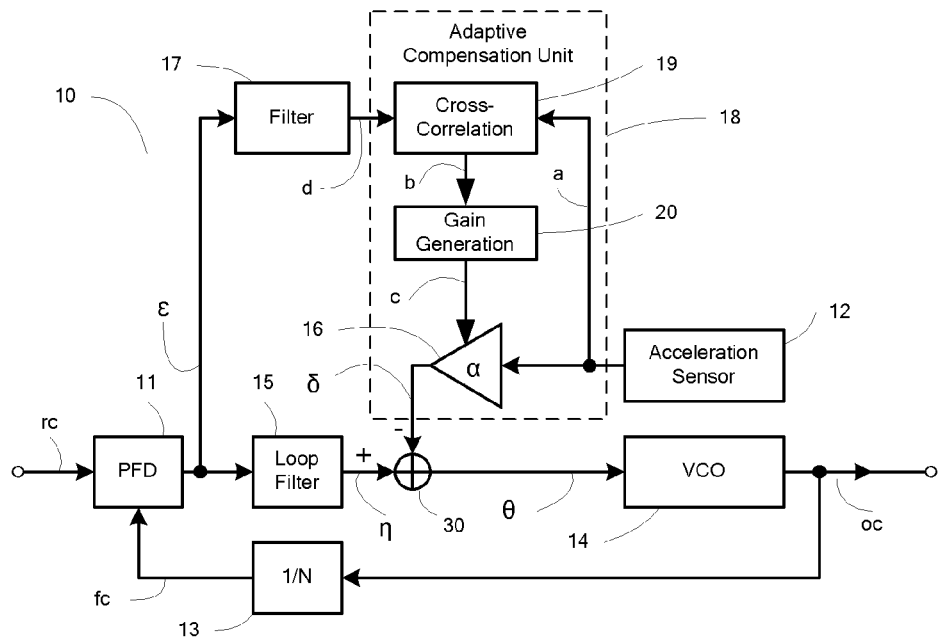
FIG. 1 illustratively shows a block diagram of a PLL according to an embodiment of the present disclosure.
FIG. 2 shows an illustrative flowchart of an adaptive compensation method for a PLL according to an embodiment of the present disclosure.

FIG. 1 shows a schematic block diagram of a preferred exemplary embodiment of the PLL according to the disclosure.

The PLL 10 according to the present disclosure comprises a PFD 11, a loop filter 15, a VCO14 which is sensitive to acceleration (e.g. a VCXO), and an optional divider device 13.

The PFD 11 determines a phase difference signal $\epsilon$ between a feedback clock signal fc and a reference clock signal rc. The PFD 11 provides the phase difference signal $\epsilon$ at the input of the loop filter 15. The loop filter 15 generates in dependent on the phase difference signal $\epsilon$ provided, an oscillator control signal $\eta$ by means of which the VCO 14 can be controlled. The VCO 14 generates an output clock signal oc which is provided to the divider device 13. The divider device 13 generates in dependent on the output clock signal oc provided, the feedback clock signal fc which is fed back to the PFD 11. The output clock signal oc may also be directly provided as the feedback clock signal fc to the PFD 11 if the divider device 13 is alternatively omitted.

The PLL 10 according to the present disclosure also comprises an acceleration sensor 12, an adaptive compensation unit 18, a filter 17 and a summing unit 30.

The acceleration sensor 12 placed close to the VCO 14 generates an acceleration signal a by detecting the acceleration on the VCO 14. The acceleration sensor 12 provides the acceleration signal a to the input of the adaptive compensation unit 18. The filter 17 generates in dependent on the phase difference signal $\epsilon$ provided by the PFD 11, a filtered phase difference signal d which is provided at a second input of the adaptive compensation unit 18. The adaptive compensation unit 18 generates a correction signal $\delta$ in dependent on the acceleration signal a and the filtered phase difference signal d. The summing unit 30 generates by summing up the correction signal $\delta$ and the oscillator control signal $\eta$, a corrected oscillator control signal $\theta$ by means of which the vibration-induced phase noise on the output clock signal oc is mitigated. The polarity of the correction signal $\delta$ depends on the polarity of the sensitivity of the VCO 14.

The adaptive compensation unit 18 may comprise a cross-correlation unit 19, a gain generation unit 20 and a variable gain amplifier (VGA) 16.

The cross-correlation unit 19 generates correlation coefficient b by calculating a cross-correlation function of the acceleration signal a and the filtered phase difference signal d. The gain generation unit 20 generates in dependent on the correlation coefficient b, a gain setting signal c, which is provided to the VGA 16 as the gain $\alpha$. The VGA 16 generates the correction signal $\delta$ by applying the gain $\alpha$ to the acceleration signal a.

The acceleration sensor 12 may be implemented by a single axis accelerometer with an orientation being consistent with the direction of acceleration sensitivity of the VCO 14.

Alternatively, the acceleration sensor 12 may comprise a plurality of accelerometers configured for sensing multiple acceleration components in a plurality directions of the acceleration on the VCO 14. The plurality of accelerometers may be placed close to the VCO 14 regardless of the direction of the acceleration sensitivity of VCO 14. Accordingly, the acceleration sensor 12 may further comprises a plurality of VGAs, each being connected to a respective output of the plurality of accelerometers for applying a respective weight to a corresponding acceleration component signal to get a weighted acceleration component signal; and a summing unit configured to summing up the weighted acceleration component signals to form the acceleration signal a. The weights may be pre-configured by measuring the direction of acceleration sensitivity of the VCO 14 or dynamically determined with methods illustrated in later sections.

It will be appreciated by the skilled in the art that the number of the VGAs (weights) should be corresponding to the number of the accelerometers.

Figure 5:
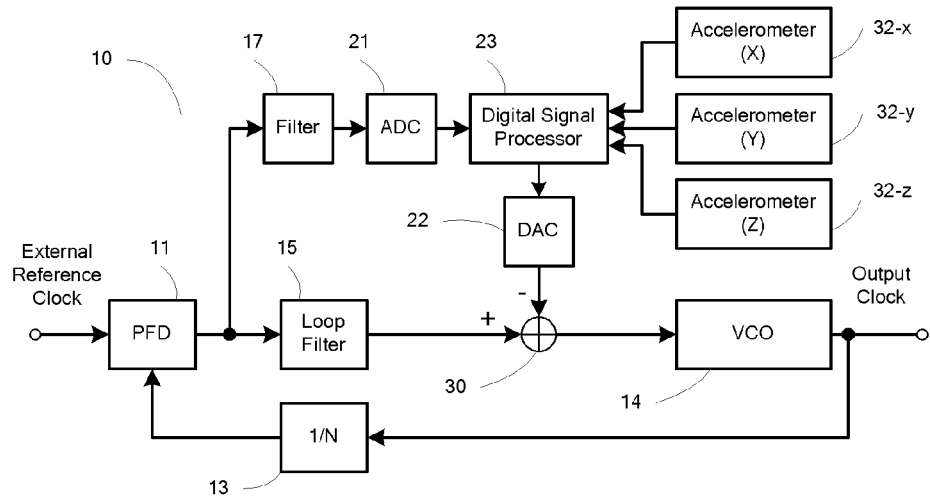
FIG. 5 illustratively shows an exemplary hardware implementation of the PLL of FIG. 1.
Figure 6:
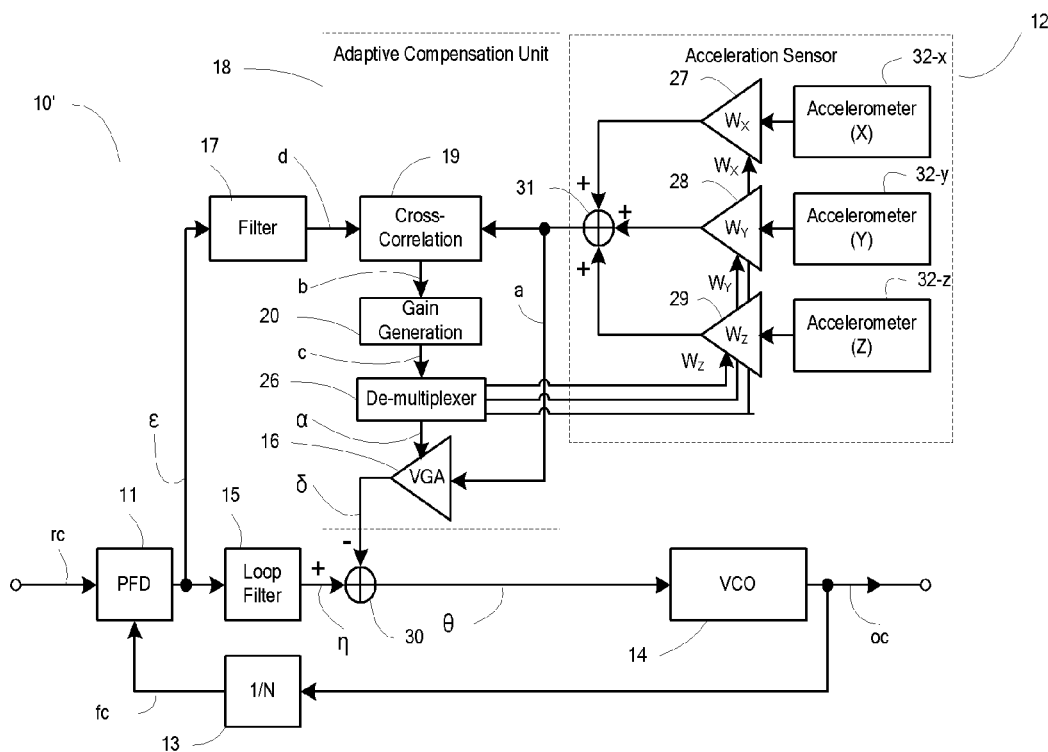
FIG. 6 illustratively shows a block diagram of a PLL according to another embodiment of the present disclosure.

For example, as illustrated in FIG. 5 and FIG. 6, the acceleration sensor 12 may comprise a 3-axis accelerometer which includes three independent accelerometers 32-x, 32-y and 32-z. In that case, the sensing direction of the acceleration sensor 12 is determined by additional devices: VGA 27, VGA 28, VGA 29, and the summing device 31, for calculating the weighted sum of the acceleration components of x, y, z axes respectively.

A certain frequency shift on the output clock of the VCO is induced when the VCO is subjected to a constant acceleration. Consequently, the varying acceleration of the mechanical vibration on the VCO will be frequency modulated onto the output clock of VCO. The modulated acceleration waveform is counted as the vibration induced phase noise. Meanwhile, because the center frequency of the output clock of the VCO is also controlled by the oscillator control voltage, a small voltage $\Delta v$ added to the oscillator control signal will generate a second frequency shift on the output clock of the VCO. Given a correct polarity and proper attenuation, adding the oscillator control signal an acceleration signal sensed by a proper configured accelerometer can generate a second frequency shift with an amount equal to and a direction opposite to the frequency shift generated by acceleration on the VCO. Because the first frequency shift and the second frequency shift are highly synchronized, they will cancel out each other at any given moment. Thus the vibration induced phase noise on the output clock of the VCO is mitigated.

FIG. 2 is a diagrammatic flowchart of acceleration compensation branch of the method according to the present disclosure. The illustrative flowchart of the method 200 in FIG. 2 omits some processing steps which are well-known to the skilled in the art, so as not to obscure the idea of the present disclosure. The method according to the present disclosure for compensating the vibration induced phase noise includes following steps:

Method Step S201:
Generating an acceleration signal a by detecting, such as sensing, the acceleration on the VCO 14.

Method Step S205:
Generating a correction signal δ by applying a gain α to the acceleration signal a.

Method Step S207:
Summing up the correction signal δ and the oscillator control signal 11 to generate a corrected oscillator control signal θ by which the vibration-induced phase noise on the output clock oc of the VCO 14 is mitigated.

Before S205, Step S203 may be added to determine if the PLL 10 is in a locked status and if there is vibration with enough intensity. If the determination result is true, the process goes to Step S205. If the determination result in Step S203 is false, the process goes to Step S206.

Method Step S206:
Setting the correction signal δ to zero so that nothing is added to the oscillator control signal η.

When the intensity of vibration is lower than certain threshold or the PLL 10 is in an unlocked status, the correction signal δ is set to zero. Equivalently, the whole adaptive compensation mechanism is bypassed and ineffective, and the PLL 10 may work like any regular PLL. The gain α of the VGA 16 may be initialized to zero so that nothing is compensated to the VCO 14 when the PLL 10 is in the initial state such as powered up. These stated mechanisms ensure that the PLL 10 will work like any regular PLL in the phases of power up, locking, and etc.

Figure 3:
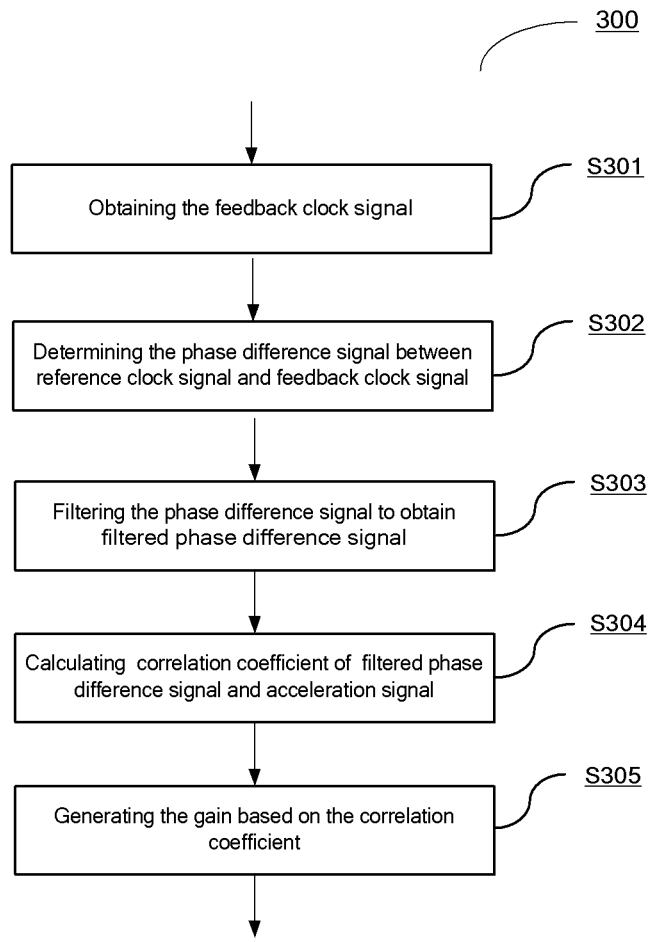
FIG. 3 shows an illustrative flowchart of a method of generating a gain according to an embodiment of the present disclosure.

FIG. 3 is a diagrammatic flowchart of the adaptive gain generation of the method according to the present disclosure. The method according to the present disclosure for automatically generating the gain α, which would then precisely adapt to the vector of acceleration sensitivity of individual sample of VCO, has the following steps:

Method Step S301, in which:
Optionally, the divider device 13 converts the output clock signal oc into the feedback clock signal fc which is then fed back to the PFD 11. Otherwise, the output clock signal oc is directly fed back to the PFD 11 as fc. The feedback clock signal fc has a center frequency fractional to that of the output clock signal oc, and a frequency modulation component identical to that of the output clock signal oc.

Method Step S302, in which:
The PFD 11 determines a phase difference signal c between the reference clock signal rc and the feedback clock signal fc. Then, the PFD 11 provides the phase difference signal ε to the loop filter 15 and the filter 17 respectively.

Method Step S303, in which:
The filter 17 generates a filtered phase difference signal d by keeping the frequency components of the phase difference signal ε which belongs to a desired bandwidth regarding to the targeting frequency band of mechanical vibration.

Method Step S304, in which:
The cross-correlation unit 19 calculates a correlation coefficient b by taking in a frame of the filtered phase difference signal d and a frame of the acceleration signal a. The correlation coefficient b is then provided to the gain generation unit 20.

Method Step S305, in which:
The gain generation unit 20 generates in dependent on the correlation coefficient b, a gain setting signal as the gain α, which is then fed to the gain setting port of the VGA 16.

The filtered phase difference signal d is a demodulated version of the acceleration frequency modulated on the output clock oc. And the acceleration signal a is a sensed version of the acceleration on the VCO 14. The cross-correlation unit 19 may determine the correlation coefficient b and an optional delay Δt between the filtered phase difference signal d and the acceleration signal a.

Figure 4:
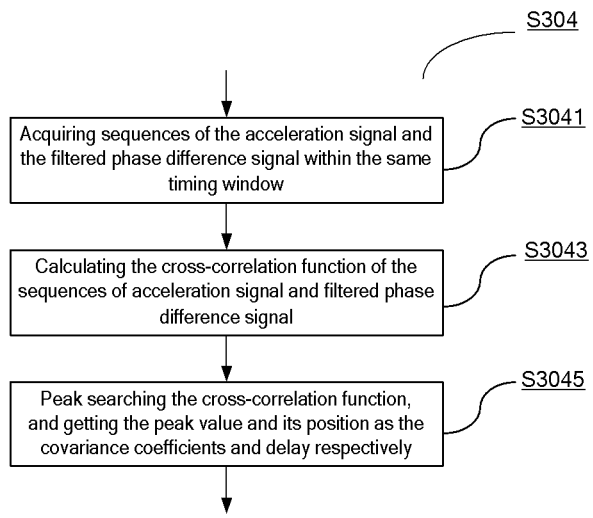
FIG. 4 shows an illustrative flowchart of calculating cross-correlation in detail, which may be a part of the flowchart of FIG. 3.

FIG. 4 is a diagrammatic flowchart of the cross-correlation unit 19 of the method according to this disclosure. The method according to the present disclosure for calculating the correlation coefficient b and the optional delay Δt, has following steps:

Method Step S3041:
Acquiring a sequence of samples of the acceleration signal a and another sequence of samples of the filtered phase difference signal d within the same timing window. The sample rate and the length of both sequences should be identical.

Method Step S3043:
Calculating a cross-correlation function of the sequences of acceleration signal a and filtered phase difference signal d. To calculate the cross-correlation function, the ratio between the amplitudes of signal a and d shall not be changed when applying normalization to signal a.

Method Step S3045:
Peak searching the cross-correlation function calculated in S3043, and output the value of the peak of the cross-correlation function as correlation coefficient b and optionally the position of the peak of the cross-correlation function as the delay Δt.

The sample rate and the length of the sequences of the filtered phase difference signal d and the acceleration signal a referred in Step S3041 and S3043 should be properly configured to cover the target frequency band in which the vibration-induced phase noise is desired to be mitigated.

As an exemplary implementation, the cross-correlation function, denoted as $\hat{R}_{ad}[m]$ may be calculated by Equation (1):

$$\hat{R}_{ad}[m] = \begin{cases} \dfrac{C}{|\vec{a}_1|^2} \sum_{n=0}^{N-m-1} a[n+m] \cdot d^*[m], & m \geq 0 \\ \hat{R}_{da}^*[-m], & m < 0 \end{cases} \quad (1)$$

Where, $|\vec{a}_1|$ is the L2-norm of vector $\vec{a}_1$ representing the acquired sequence of samples of acceleration signal a, which is defined as $$|\vec{a}_1| = \sqrt{\sum_{n=0}^{N-1} a[n]^2}.$$

The correlation coefficient b may be determined by Equation (2):

$$b = \hat{R}_{ad}[\hat{m}], \left(\hat{m} = \arg\max_{m} \left(\left|\hat{R}_{ad}[m]\right|\right)\right) \quad (2)$$

The delay Δt may be determined by Equation (3):

$$\Delta t = \hat{m} = \arg\max_{m} \left(\left|\hat{R}_{ad}[m]\right|\right) \quad (3)$$

Where, the N is the length of the sequences referred by Step S3041 and S3043, C is an constant typically equals to N or 1, and m is an integral satisfying −N<m<N.

According to S303, the relative level of the vibration induced phase noise referring to the acceleration on the VCO 14 is represented by the correlation coefficient b based on which the gain generation unit 20 generates the gain α.

Preferably, the gain generation unit 20 updates its output incrementally. And there are several available implementations for the gain generation unit 20. One exemplary implementation of the gain generation unit 20 is a lookup table mapping each correlation coefficient b to a certain increment which is then added to its output.

Another exemplary implementation of the gain generation unit 20 is a proportional integral derivative (PID) controller for performing the PID algorithm with pre-determined parameters: a proportional gain $K_p$, an integral gain $K_i$, and a derivative gain $K_d$. The PID algorithm generates in dependent on the time series of correlation coefficient b, the output c of the unit 20 according to Equation (4):

$$c[t] = K_p b[t] + K_i \sum_{n=0}^{t} b[n] + K_d(b[t] - b[t-1]) \quad (4)$$

In Equations (1)-(4), a[t], b[t], c[t], d[t] represent a sample of signal a, b, c, d on time t respectively, where the t is a general time symbol which could be replaced by any other letter or symbol. The sample rates of signal a, b, c or d are irrelevant with each other by default unless identical time symbol is used for these signals in a certain equation or group of equations.

Equation (4) also has many other well known equivalent representations such as differential form, which should be deemed as different alternatives within the scope of this disclosure.

A negative feedback control loop is constructed by the gain generation unit 20 as the controller, the acceleration compensation branch and the VCO 14 as the executor, and the divider device 13, the PFD 11, the filter 17, and the cross-correlation unit 19 as the measurement and feedback branch. In the loop, the gain generation unit 20 adjusts its output with either positive or negative increments to ensure the correlation coefficients b, which represents the relative level of the vibration-induced phase noise, would be changed towards zero through the executor. The parameters or lookup table of the gain generation unit 20 are configured to ensure that larger magnitude of correlation coefficient b produces larger magnitude of gain increments. As a result, when the correlation coefficient b offsets far from zero, which means the PLL 10 is under compensated or over compensated, the gain α will be adjusted dramatically to pull it back to zero. While as the covariance coefficient b approximates zero, the gain α will be adjusted slightly and eventually converge to a certain value. When the close loop converges, the vibration-induced phase noise is minimized.

It should be noted that the flowchart of FIG. 2 is just for a simplified description of the data/signal flow. The steps in the flowchart are usually organized in a pipelined fashion and executed concurrently by different modules.

In a hardware implementation, the adaptive algorithm performed by the adaptive compensation unit 18 is preferably executed in a digital form. As illustrated in FIG. 5, The adaptive compensation unit 18 may be implemented by a digital signal processor (DSP) 23. In this case, the outputs of acceleration sensor 12 are digital. The acceleration sensor 12 may be implemented by one or three digital accelerometers, or by one or three analog accelerometers respectively followed by three additional analog digital converters (ADCs) (not shown). An ADC 22 may be arranged between the filter 17 (e.g. a low pass filter or a bandpass filter) and the DSP 23 for converting the filtered phase difference signal from analog signal to digital signal. The DSP 23 may acquire digital signals from the ADC 22 and the accelerometers 12, implement the adaptive algorithm, and output a digital correction signal which may be converted into an analog signal by a digital analog converter (DAC) 23 and then added to the oscillator control signal to form the corrected oscillator control signal for the VCO 14.

FIG. 5 is an example for the hardware implementation of the PLL of FIG. 1. However, it will be understood by the skilled in the art that the implementation of FIG. 5 is just illustrative but not for any limitation. Any appropriate hardware implementations of the PLL 10 according to the present disclosure may be contemplated by the skilled in the art. For example, the adaptive algorithm or part(s) of the adaptive algorithm may also be executed by analog device(s).

There may be many existing products of DSP and Microprocessor with peripherals like ADC(s), memory, 3-axis accelerometers and DAC(s) with qualified performance to implement the present disclosure. With the prior art of microelectronics, it is also feasible to implement the entire acceleration compensated PLL 10 except the VCO 14, the filter 15 and the filter 17 within a single SoC (System on Chip).

FIG. 6 is a schematic block diagram of another exemplary embodiment of the PLL according to the present disclosure, in which the acceleration sensor 12 comprises a 3-axis accelerometer with orientation regardless of the direction of the acceleration sensitivity of VCO 14, three variable gain amplifiers VGA 27, VGA 28, and VGA 29, and a summing unit 31.

As illustrated in the PLL 10' of FIG. 6, the acceleration sensor 12 comprises three independent accelerometers 32-x, 32-y and 32-z for generating three output signals $a_x$, $a_y$, and $a_z$ by sensing the acceleration components of X, Y, and Z axes in free space respectively. The VGAs 27, 28, 29 apply three weights $W_X$, $W_Y$, $W_Z$, to each components signals $a_x$, $a_y$, and $a_z$ respectively. The summing unit 31 generates by summing up all the three weighted signals provided by the VGA 27, 28, 29, the acceleration signal a which is then provided to the adaptive compensation unit 18 as described previously.

In the present embodiment, the adaptive compensation unit 18 may further comprise a de-multiplexer 26 for forwarding the gain setting signal c from the gain generation unit 20 to any selected one of the gain setting ports of all the four variable gain amplifiers VGA 16, VGA 27, VGA 28 and VGA 29 according to the methods of the present disclosure described in following sections.

Figure 7:
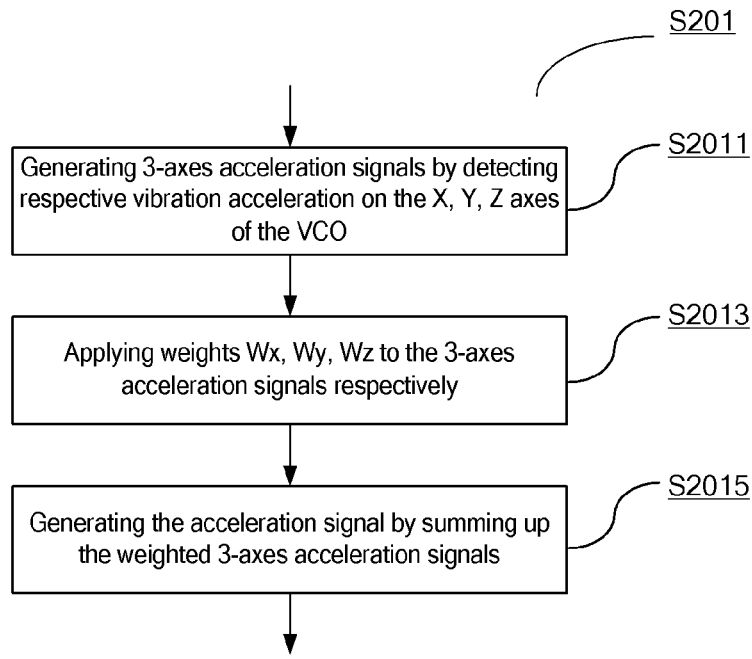
FIG. 7 shows an illustrative flowchart of generating an acceleration signal in detail in the PLL as illustrated in FIG. 6, which is a part of a flowchart of FIG. 2.

FIG. 7 is a diagrammatic flowchart of the method for generating an acceleration signal by the acceleration sensor 12 as shown in FIG. 6 according to the present disclosure. The method according to the present disclosure for generation of the acceleration signal has the following steps:

Method Step S2011, in which
The three accelerometers 32-x, 32-y, 32-z generate triple axes acceleration signals $a_x$, $a_y$, $a_z$ by sensing respective acceleration components of the X, Y, Z axes of the VCO 14.

Method Step S2013, in which
The VGAs 27, 28, 29 by applying weights $W_X$, $W_Y$, $W_Z$ to triple axes acceleration component signals $a_x$, $a_y$, $a_z$ respectively, generate triple weighted axes acceleration component signals.

Method Step S2015, in which
The summing unit 31 generates the acceleration signal a by summing up the triple weighted axes acceleration component signals provided by the VGAs 27, 28, 29.

Figure 8:
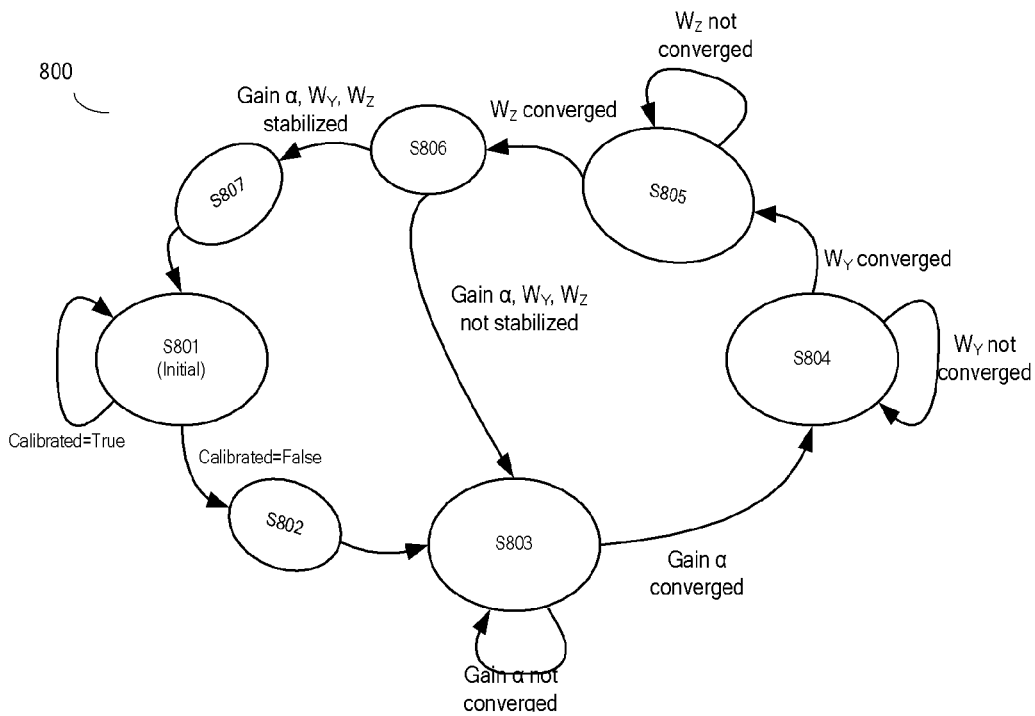
FIG. 8 shows an illustrative flowchart of calibrating e.g. weights $W_X$, $W_Y$ and $W_Z$ respectively for 3-axes acceleration signals in detail, which may be a part of the flowchart of FIG. 7.

Preferably, the weights $W_X$, $W_Y$, $W_Z$ are automatically determined by a finite state machine (FSM) illustrated in FIG. 8 based on the methods of adaptive compensation mechanism stated as the processes 200 and 300. The FSM, process 200 and process 300 may work in parallel.

Alternatively, the weights $W_X$, $W_Y$, $W_Z$ may also be pre-determined in dependent on the measurement of parameters of the sample of the VCO 14. In this case, neither the de-multiplexer 26 nor the FSM illustrated in FIG. 8 is needed, and the gain generation unit 20 provides the gain setting signal c to the VGA 16 directly as illustrated in FIG. 1.

As illustrated in FIG. 8 and in connection with FIG. 7, the method 800 for automatically calibrating the weights $W_X$, $W_Y$, $W_Z$ of the acceleration sensor 12 as shown in FIG. 6 according to the present disclosure is as follows:

State S801, in which:
The de-multiplexer 26 forwards the gain setting signal c from the gain generation unit 20 to the gain setting port of the VGA 16. The FSM would be initialized to this state after power on or reset. If the weights $W_X$, $W_Y$, $W_Z$ are marked as calibrated ('calibrated=True'), the FSM stays in State S801. Otherwise, if the weights $W_X$, $W_Y$, $W_Z$ are not marked as calibrated ('calibrated=False'), the FSM will switch to State S802.

State S802, in which:
The weights $W_X$, $W_Y$, $W_Z$ is initialized as $W_X=1$, $W_Y=0$, $W_Z=0$. And then, the FSM switches to State S803.

State S803, in which:
The de-multiplexer 26 forwards the output signal c from the gain generation unit 20 to the gain setting port of the VGA 16 as the gain α. The weights $W_Y$ and $W_Z$ are held as their most recently determined values. The processes 200 (or 1100) and 300 are performed, by means of which the gain α is continually updated by the gain generation unit 20. If the gain α is converged to a certain value, the gain α is determined as that value and the FSM will switch to State S804. If the gain α is not converged yet, the FSM stays on State S803.

State S804, in which:
The de-multiplexer 26 forwards the output signal c from the gain generation unit 20 to the gain setting port of VGA 28 as the weight $W_Y$. The gain α and $W_Z$ are held as their most recently determined values. The processes 200 (or 1100) and 300 are performed, by means of which the weight $W_Y$ is continually updated by the gain generation unit 20. If the weight $W_Y$ is converged to a certain value, the $W_Y$ is determined as that value and the FSM will switch to state S805. If $W_Y$ is not converged yet, the FSM stays on State S804.

State S805, in which:
The de-multiplexer 26 forwards the output signal c from the gain generation unit 20 to the gain setting port of VGA 29 as the weight $W_Z$. The gain α and $W_Y$ are held as their most recently determined values. The processes 200 (or 1100) and 300 are performed, by means of which the weight $W_Z$ is continually updated by the gain generation unit 20. If the weight $W_Z$ is converged to a certain value, the $W_Z$ is determined as that value and the FSM will switch to state S806. If $W_Z$ is not converged yet, the FSM stays on State S805.

State S806, in which:
The current determined gain α, $W_Y$, $W_Z$ are compared respectively to their recent values determined by initialization and/or previous iteration(s) (an iteration comprises States S803, S804, and S805). If the gain α, $W_Y$, $W_Z$ determined by each iteration(s) are converged respectively, or in other words, the variances of respective time series of the gain α, $W_Y$ and $W_Z$ determined by arbitrary number of recent iteration(s) are smaller than a predetermined threshold, the FSM will switch to state S807. Otherwise, if the gain α, $W_Y$, or $W_Z$ determined by each iteration(s) are not converged, the FSM will switch to state S803.

State S807, in which:
The weights $W_X$, $W_Y$, $W_Z$ are marked as calibrated ('calibrated is assigned as True'). Then the FSM will switch to state S801.

According to the embodiments of the PLL in FIG. 6 and the methods in FIGS. 7 and 8 as illustrated above, the sensing direction of the acceleration sensor 12 as shown in FIG. 6 can be automatically calibrated to be consistent with the direction of acceleration sensitivity of the VCO 14 regardless of the orientation of the 3-axis accelerometer.

It should be noted that the PLL 10 illustrated in FIG. 6 and the methods illustrated in FIG. 7 and FIG. 8 are only examples to illustrate the approach for determining the sensing direction of the acceleration sensor 12 according the present disclosure, which essentially describes iteratively calculating a plurality of compensation gains for respective axes, where in each iteration, the compensation gains are calculated one by one, and when one compensation gain is being calculated, the rest ones are held to their current values.

In FIG. 6, the relations between any two acceleration sensing branches of X, Y, and Z axes are symmetric, and the VGA 16 is connected in series with the VGAs 27, 28, 29 respectively, which means that the actual gains for the three axes are $\alpha W_X$, $\alpha W_Y$ and $\alpha W_Z$, respectively. As a result, the skilled in the art may contemplate many alternative implementations mathematically equivalent to the methods illustrated in FIG. 7 and FIG. 8 and many corresponding alternative implementations mathematically equivalent to the embodiment illustrated in FIG. 6, based on the above exemplary embodiments of FIGS. 6-8.

Figure 9:
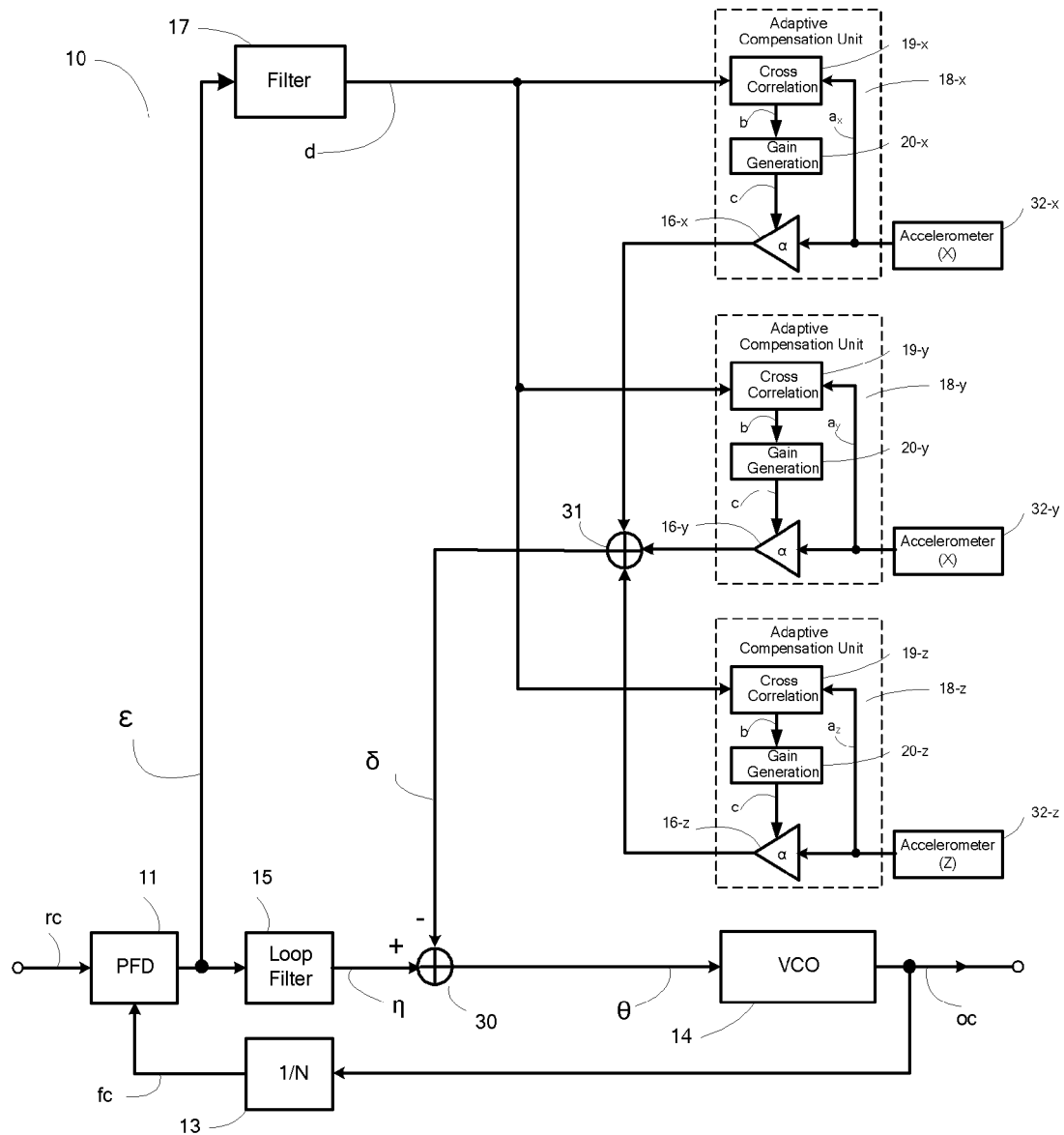
FIG. 9 illustratively shows a block diagram of a PLL according to another embodiment of the present disclosure.

For example, an alternative embodiment (as shown in FIG. 9) for the PLL according to the present disclosure is that there are three correction signal components generated by three adaptive compensation units connected to the three acceleration signal components of three axes respectively, the summing unit 31 generates the correction signal δ by summing up the three correction signal components of three axes. Then the summing unit 30 generates the corrected oscillator control signal θ by adding the correction signal δ to the oscillator control signal η. In that case, the method 800 as illustrated in FIG. 8 can still be used for determining the component compensation gains $\alpha_X$, $\alpha_Y$, and $\alpha_Z$ for X, Y and Z axes respectively by simply replacing the gain α, $W_Y$ and $W_Z$ in FIG. 8 with $\alpha_X$, $\alpha_Y$, and $\alpha_Z$, respectively, and omitting the operation for $W_X$ in method 800.

Similarly, a second alternative embodiment of the method 800 according to the present disclosure will still be available by exchanging the gain α and $W_X$ in method 800 of FIG. 8, and/or change the initial value 1 to any other constant.

If the gain α is initialized and fixed to 1 according to the second alternative embodiment of the method 800, the VGA 16 equals to being bypassed. In this case, the PLL 10 in FIG. 6 is available by replacing the VGA 16 with a direct connection.

Due to the symmetric relations between any two of $W_X$, $W_Y$ and $W_Z$, the skilled in the art may contemplate that the operation order of calibrating $W_X$, $W_Y$ and $W_Z$ in method 800 may be exchanged. Any alternative methods completely equivalent with the method 800 or other alternative methods for calibrating $W_X$, $W_Y$ and $W_Z$ based on the above idea of the present disclosure also fall into the scope of the present disclosure.

Similarly, all of these above embodiments for 3-axis accelerometer cases could be extended to any other dimensions, which are all fall into the scope of the present disclosure.

In this case, the weights for the plurality of VGAs are determined by steps of:

a) judging (e.g. S801) whether the current weights are marked as calibrated;

b) initially (e.g. 802) setting one of the gain and the weights to be a non-zero constant, and the others of the gain and the weights to be 0, if it is judged that any one of the current weights is not marked as calibrated;

c) sequentially (e.g. S803, S804, 805) repeating an iteration as follows on each of the VGAs of which the gain or the weight is initialized to be 0 in b), i.e., on the acceleration signal or the acceleration component signal to which the gain or the weight initialized to be 0 in b), until all of at least one of the gain or weights are determined:

forwarding the gain setting signal from the gain generation unit (20) to the selected one of the VGAs, meanwhile holding the gain or weight of each of the rest VGAs as its value being determined by the previous iteration;

letting the PLL (10') work for continually updating the gain or weight of the selected VGA until the gain or weight of the selected VGA is converged to a certain value which is then determined as the gain or weight of the selected VGA in the current iteration;

d) deciding (S806) whether the at least one of the gain or weights determined in c) are converged by judging whether the variances of respective time series of the gain and weights determined by arbitrary number of recent iteration(s) performed in c) are smaller than a predetermined threshold;

e) repeating c)-d), until it is decided that the at least one of the current determined gain or weights are converged; and f) marking (S807) the current determined weights as calibrated.

According to another exemplary embodiment of the present disclosure, the adaptive compensation unit 18 may further comprise a filter 25 connected in series with the VGA 16, and an equalization coefficient estimator 24, for compensating the frequency response of the tuning circuit of the VCO 14 (cf. Reference [10], [11], [19]), by means of which the performance of adaptive compensation for high frequency vibration could be further improved.

Figure 10:
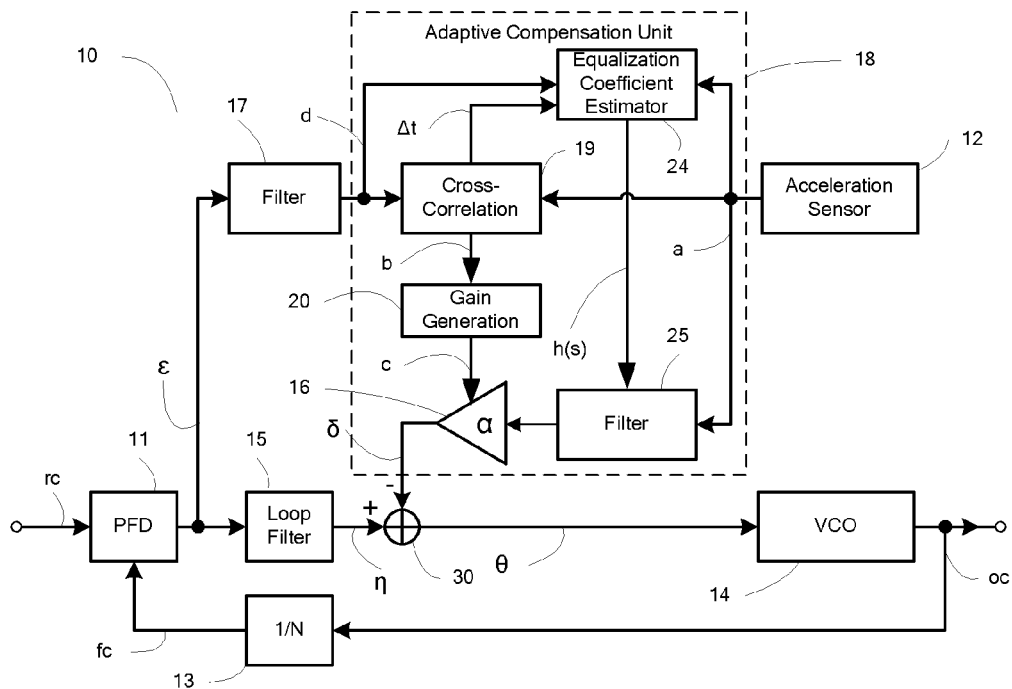
FIGS. 10 (a)-(b) illustratively show block diagrams of a PLL according to other embodiments of the present disclosure.
Figure 10:
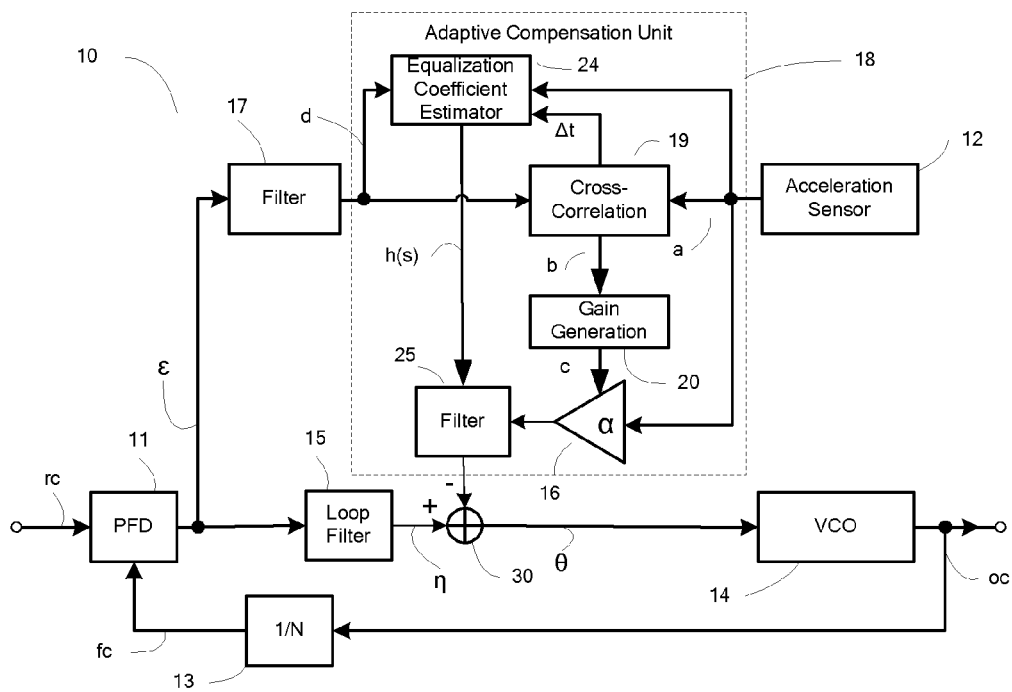

FIGS. 10 (*a*)-(*b*) are schematic block diagrams of other exemplary embodiments of the PLL according to the present disclosure, in which the adaptive compensation unit 18 comprises the filter 25 and the equalization coefficient estimator 24 as mentioned above. Preferably, the filter 25 in the present embodiment is a digital filter.

Preferably, as illustrated in FIG. 10 (*a*), the acceleration signal a is provided to the filter 25 for equalization. The filter 25 generates in dependent on the acceleration signal a, an equalized acceleration signal which is provided to the VGA 16.

Alternatively, as illustrated in FIG. 10 (*b*), the filter 25 may be placed after the VGA 16 (not shown). In this case, the correction signal δ is provided to the filter 25 for equalization. The filter 25 generates in dependent on the correction signal δ, an equalized correction signal which is provided to the summing unit 30.

In any of the above two embodiments, the filter coefficients of filter 25 are provided by the equalization coefficient estimator 24.

The equalization coefficient estimator 24 generates the filter coefficients in dependent on three inputs: the filtered phase difference signal d, the delay Δt provided by the cross-correlation unit 19, and the acceleration signal a.

The descriptions on components in FIG. 10 other than the equalization coefficient estimator 24, the filter 25 and the delay Δt provided by cross-correlation unit 19, are identical with those with the same reference numbers as described with reference to FIG. 1, and thus are omitted for simplicity.

Figure 11:
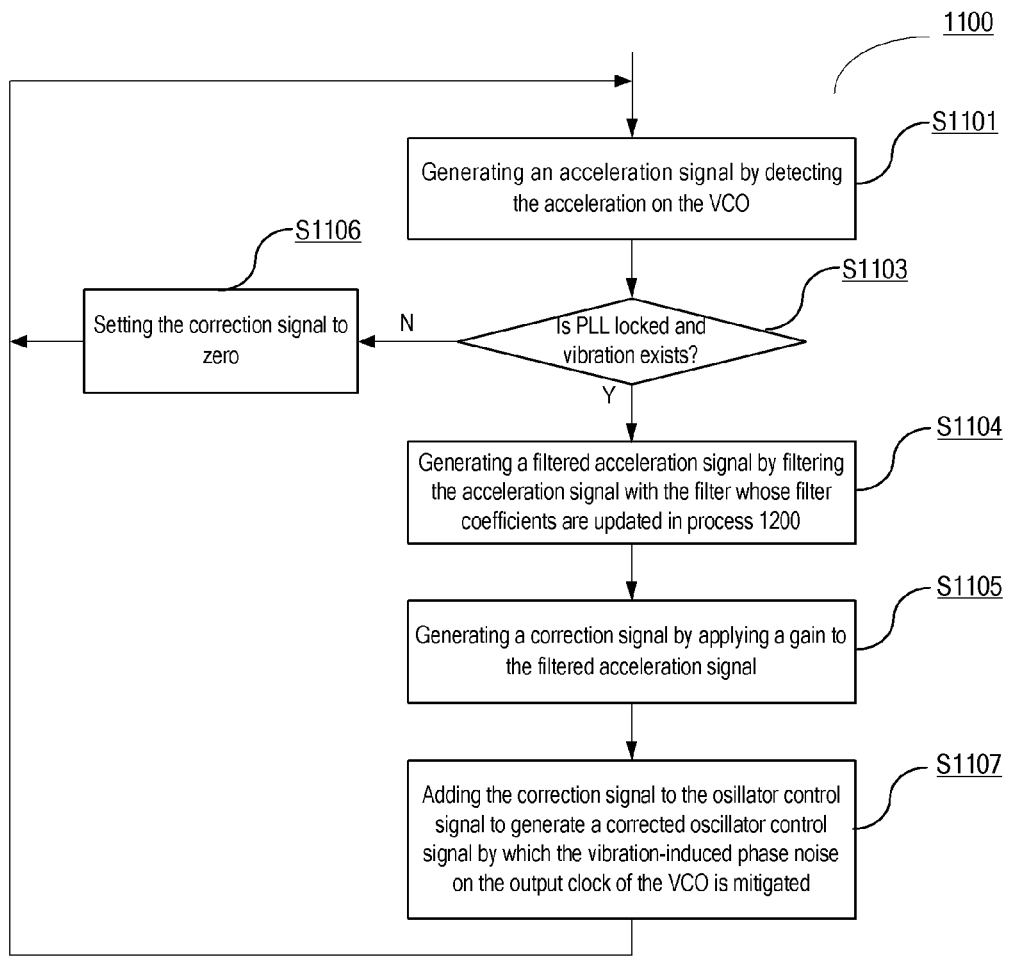
FIG. 11 (a)-(b) show illustrative flowcharts of an adaptive compensation method for the PLL according to the embodiment as illustrated in FIGS. 10 (a)-(b)
Figure 11:
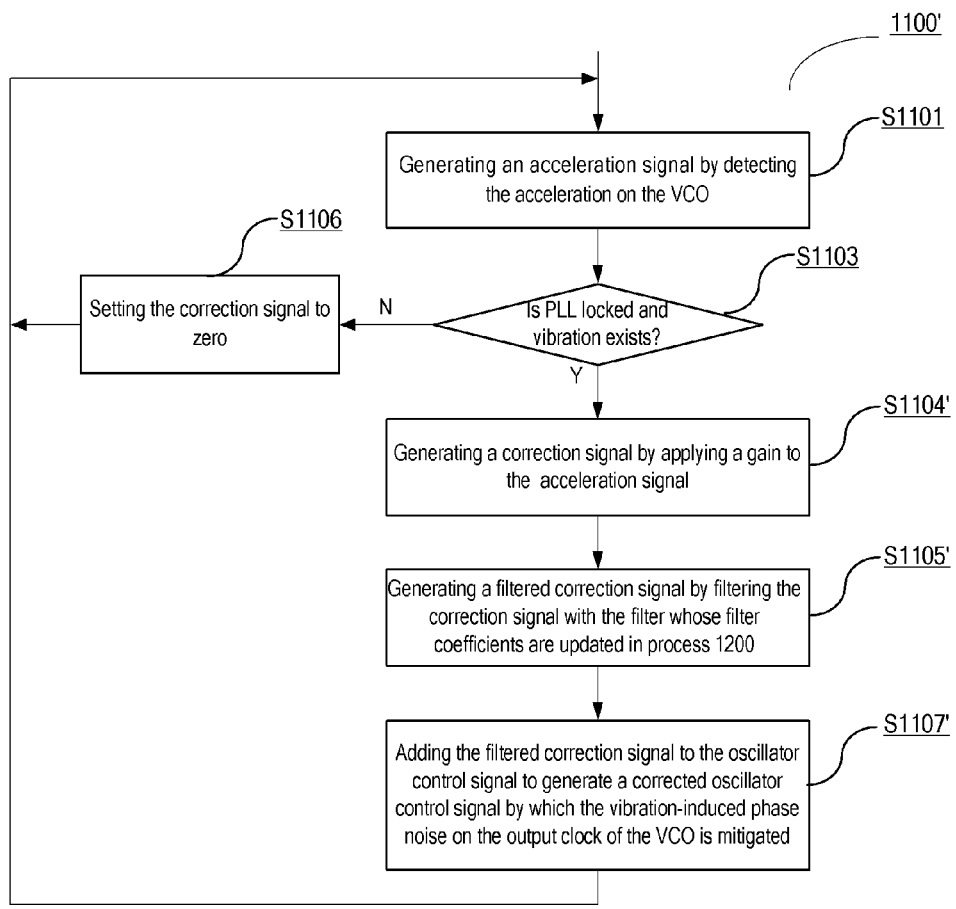

FIGS. 11 (*a*)-(*b*) are diagrammatic flowcharts of the acceleration compensation branch with the filter 25 as shown in FIGS. 10 (*a*)-(*b*) of the method according to the exemplary embodiment of the present disclosure respectively. Hereinafter, FIG. 11(*a*) is taken as an example for illustration only. The steps of the method 1100 of FIG. 11 (*a*) are identical with those of FIG. 2, except that a step S1104 of filtering the acceleration signal with the filter 25 is added before applying the gain α to the acceleration signal. In FIG. 11 (*a*) and FIG. 2, like reference numbers refer to like method steps. The method according to the present embodiment of the disclosure for compensating the vibration induced phase noise includes following steps:

Method Step S1101:

Generating an acceleration signal a by sensing the acceleration on the VCO 14.

Method Step S1104:

Generating a filtered acceleration signal by filtering the acceleration signal a with the filter 25, where the filter coefficients of the filter 25 is updated in a process 1200 in FIG. 12, which will be described in detail later.

Method Step S1105:

Generating a correction signal by the VGA16 applying the gain α to the filtered acceleration signal.

Method Step S1107:

Summing up by the summing unit 30 the correction signal δ and the oscillator control signal η to generate a corrected oscillator control signal θ by which the vibration-induced phase noise on the output clock oc of the VCO 14 is mitigated.

Before Step S1104, Step S1103 may be added to determine if the PLL 10 or 10' is in a locked status and there is vibration with enough intensity. If the determination result is true, the process goes to Step S1104. If the determination result in Step S1103 is false, the process goes to Step S1106.

Method Step S1106:

Setting the correction signal δ to zero so that nothing is added to the oscillator control signal η.

In the alternative embodiment where the filter 25 placed after the VGA 16 as shown in FIG. 10 (*b*), the method steps of the acceleration compensation branch of the method 1100' according to the exemplary embodiment of the present disclosure are identical with those of FIG. 11(*a*), except steps S1104'-S1107' as illustrated in FIG. 11 (*b*), where in step S1104', the correction signal is generated by applying the gain to the acceleration signal; in step S1105', the filtered correlation signal is generated by filtering the correction signal with the filter whose filter coefficients are updated in the process 1200; and in step S1107', the filtered correction signal is added to the oscillator control signal to generate a corrected oscillator control signal.

Additionally, the process of obtaining the gain α in the present method is completely identical with that in FIG. 3, and thus the description thereof is omitted for simplicity.

As will be understood by the skilled in the art, the step S1101 of generating the acceleration signal may be alternatively implemented by the steps S2011-S2015 in FIG. 7. Thus, the descriptions thereof are omitted here for simplicity.

Figure 12:
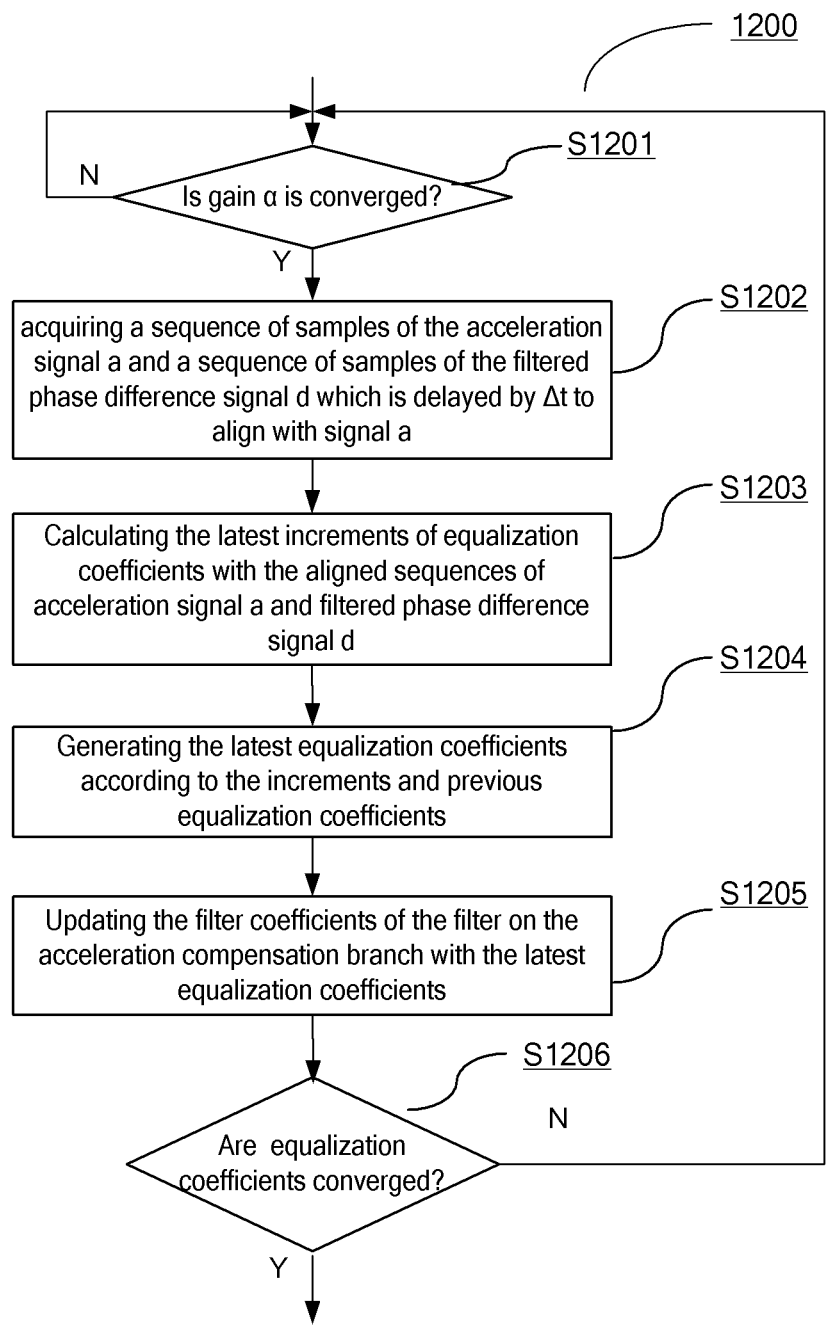
FIG. 12 shows an illustrative flowchart of a method of updating filter coefficients in detail, which may be used for equalizing the acceleration signal in the flowcharts of FIGS. 11 (a)-(b)

FIG. 12 is a diagrammatic flowchart of the method for incrementally calculating the equalization coefficients and applying them to the filter 25 by the equalization coefficient estimator 24 according to the present disclosure. The method 1200 has following steps:

Method Step S1201:
  Checking if the gain α is converged, and then, going to Step S1202 if the gain α is converged, or returning to Step S1201 if the gain α is not converged.
Method Step S1202:
  Acquiring a sequence of samples of the acceleration signal a and another sequence of samples of the filtered phase difference signal d which is delayed by Δt to be aligned with signal a. The Δt is provided by the cross-correlation unit 19. The sample rate and the length of both sequences shall be identical.
Method Step S1203:
  Calculating the latest increments of equalization coefficients with the two aligned sequences of acceleration signal a and filtered phase difference signal d.
Method Step S1204:
  Generating the latest equalization coefficients according to the increments and the most recent previous equalization coefficients.
Method Step S1205:
  Updating the filter coefficients of the filter 25 with the latest equalization coefficients.
Method Step S1206:
  Check if the equalization coefficients are converged to certain values, and then go to the S1201 if the equalization coefficients are not converged, or end the process if the equalization coefficients are converged.

Figure 13:
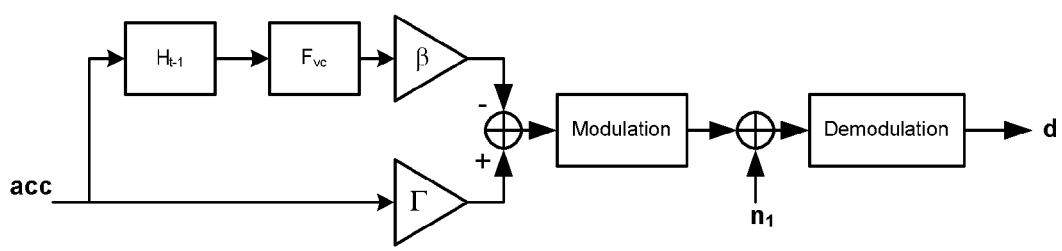
FIG. 13 illustratively shows a system model for calculating the equalization coefficients according to the method of FIG. 12.

To illustrate the mathematical algorithm for calculating the equalization coefficients according to the method as illustrated in FIG. 12, a system model as shown in FIG. 13 is useful It is assumed in FIG. 13 that acc is the acceleration on the VCO 14; $H_{t-1}$ is a frequency response of the filter 25 determined by most recent previous equalization coefficients; $F_{vc}$ is a frequency response of the tuning circuit of the VCO 14; gain β is the modulation gain of the acceleration compensation branch which is determined by the sensitivity of acceleration sensor 12, the gain α, and the sensitivity of VCO 14; Γ is the acceleration sensitivity of the VCO 14 which represents the modulation gain of acceleration; and $n_1$ is random noise. The frequency shifts induced by acceleration and oscillator control voltage are abstracted to a frequency modulation process. The PFD 11 and the filter 17 are abstracted to a frequency demodulation process.

When the gain α is converged, the gain β equals to Γ. The modulation and demodulation processes in the system model could be simplified as a demodulation gain and a delay Δt. And because the sequences of acceleration signal a and the filtered phase difference signal d are normalized in following calculation, both the modulation gain and the demodulation gain are omitted. The acquired sequences of acceleration signal a and filtered phase difference signal d are aligned according to the delay Δt calculated by the cross-correlation unit 19, as illustrated in method Step S1202. So the delay Δt is also omitted. As a result, the system model could be simplified to the model as shown in FIG. 14.

Figure 14:
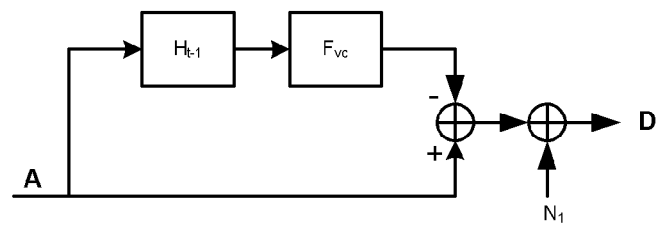
FIG. 14 illustratively shows a simplified system model for calculating the equalization coefficients according to the method of FIG. 12.

In the model of FIG. 14, the input vector A is obtained by applying a Discrete Fourier Transform (DFT) to the normalized vector $\vec{a}_2$ as equation (5), where $\vec{a}_2$ denotes the acquired sequence of samples of acceleration signal a; and the output vector D is obtained by applying a DFT to the normalized vector $\vec{d}_2$ as equation (6) where $\vec{d}_2$ denotes the acquired sequence of samples of filtered phase difference signal d; and $N_1$ is the frequency domain representation of random noise.

$$A = DFT\left(\frac{\vec{a}_2}{|\vec{a}_2|}\right) \tag{5}$$

$$D = DFT\left(\frac{\vec{d}_2}{|\vec{d}_2|}\right) \tag{6}$$

According to the simplified system model in FIG. 13, there is $$D = AH_{t-1}F_{vc} - A + N_1 \tag{7}$$

Noise $N_1$ is ignored for simplicity, then the frequency response of acceleration compensation branch $H_{t-1}F_{vc}$ is estimated by $$H_{t-1}F_{vc} = \frac{D}{A} + I \tag{8}$$

Where I is the unit vector with the same dimension of D and A.

The incremental frequency response ΔH to be estimated is supposed to make the frequency response of the acceleration compensation branch be unit vector I, as illustrated in Equation (9)

$$\Delta H \cdot H_{t-1} \cdot F_{vc} = I \tag{9}$$

Therefore, the ΔH is calculated by Equation (10)

$$\Delta H = \frac{I}{H_{t-1} \cdot F_{vc}} \tag{10}$$

And the latest $H_t$ is estimated by Equation (11)

$$H_t = \Delta H \cdot H_{t-1} \tag{11}$$

According to Equation (8)(10)(11), there is $$H_t = \frac{A \cdot H_{t-1}}{D + A} \tag{12}$$

And the latest equalization coefficients $h_t(s)$ could be obtained by apply Inverse Discrete Fourier Transform (IDFT) to $H_t$ $$h_t(s) = IDFT(H_t) \tag{13}$$

The equalization coefficient estimator 24 estimates the latest equalization coefficients $h_t$ incrementally based on equation (5), (6), (12) and (13).

It will be appreciated by the skilled in the art that the above exemplary algorithm is only illustrative but not for any limitation. Any other appropriate estimation algorithm for estimating the equalized filter coefficient by the equalization coefficient estimator 24 may also be possible.

When the acceleration sensitive VCO is subjected to a vibration with uniformly distributed power spectral density, the energy of vibration induced phase noise would concentrate in the lower frequency (cf. Reference [1]). As a result, the estimator 24 and the filter 25 could be eliminated in practice for simplicity or cost consideration according to the performance requirement.

All the working parameters according to the present disclosure, such as $W_X$, $W_Y$, $W_Z$, equalization coefficients of the filter 25, the gain $\alpha$ of VGA 16, PID factors of the gain generation unit 20 could be saved when the performance of PLL 10 is optimized, and be loaded when the PLL 10 is powered on or restarted so that the optimal performance of PLL 10 could be quickly recovered.

The present disclosure also proposes an apparatus comprising the PLL according to the embodiments as illustrated above. The apparatus may comprise at least one of: a base station on a tower; a vehicle-carried equipment, such as wireless communication terminals, radar, navigator and/or scientific instrument on cars, trains, ships, airplane, helicopter, rockets, or space shuttle; and a high-speed network/digital communication equipment, e.g. a high-speed gateway application, a high speed router, a high-throughput cloud storage equipment etc.

The present disclosure may keep some the advantages of the existing active compensation approaches, such as, compact size, low weight, no need of additional mechanical resonance, and no need of special assembly line or manufacturing art. Meanwhile compared to the existing active compensation methods, the present disclosure has better compensation accuracy and adaptivity, and may eliminate cumbersome pre-calibration and/or pre-configuration operations and facilities in manufacturing, thus reducing the cost.

Embodiments of the present disclosure may achieve some of the advantages as follows:
1. Better compensation accuracy in both magnitude and phase;
2. Adaptive to different samples, temperatures, aging status, and working frequencies;
3. The close loop control mechanism can eliminate the temperature drift of analog devices (e.g. amplifier, operation amplifier or filter);
4. Self-calibration while working, no pre-calibration or pre-configuration in manufacturing required;
5. Better Intellectual Property Protection: core algorithm implemented in software;
6. Able to be implemented on integrated circuit (IC), compact size, low weight;
7. Low cost: present disclosure requires normal crystal oscillator, no additional measurement or selection required, no special assembly line or manufacture art required; and
8. Better performance coherence in massive production.

The above is only the preferred embodiments of the present disclosure and the present disclosure is not limited to the above embodiments. Therefore, any modifications, substitutions and improvements to the present disclosure are possible without departing from the spirit and scope of the present disclosure.

REFERENCE DOCUMENT LIST

[1] R. L. Filler, "The acceleration sensitivity of quartz crystal oscillators: a review," Ultrasonics, Ferroelectrics and Frequency Control, IEEE Transactions on, vol. 35, no. 3, pp. 297-305, May 1988

[2] Gregory Ernst, et al., "Reducing Phase Noise Degradation Due To Mechanical Vibration on High Performance Quartz Resonator Oscillators for Gateway Applications," Frequency Control Symposium, 2008 IEEE International,

[3] Patent: EP1535350(B1), MORLEY, Peter, et, al., "Low Acceleration Sensitivity Mounting Structures for Crystal Resonators," 2003

[4] Patent: U.S. Pat. No. 4,451,755(A), John R. Vig, et, al., "Acceleration Sensitivity Reduction Method," 1982

[5] Patent: GB2439606(B), Nigel David Hardy, et al., "An Oscillator", 2006.

[6] Patent: US20120223785(A1), Steven Fry, et al., "Crystal Oscillator With Reduced Acceleration Sensitivity," 2012

[7] Patent: U.S. Pat. No. 8,390,388(B1), Ted J. Hoffmann, et al., "Differential Cancellation of Vibration Interference in Oscillators," 2011

[8] Rosati, V. R.; Filler, R. L., "Reduction of the Effects of Vibration on SC-Cut Quartz Crystal Oscillators," Thirty Fifth Annual Frequency Control Symposium. 1981, vol., no., pp. 117,121, 27-29 May 1981

[9] Rosati, V. J., "Suppression of Vibration-Induced Phase Noise in Crystal Oscillators: an Update," 41st Annual Symposium on Frequency Control. 1987, vol., no., pp. 409,412, 27-29 May 1987

[10] Patent: U.S. Pat. No. 4,891,611(A), Marvin E. Frerking, "Vibration Compensated Crystal Oscillator," 1989

[11] Patent: U.S. Pat. No. 5,786,735(A), Wei Su, "Phase and Magnitude Compensated Tuning For Suppression of Vibration Induced Phase Noise of Crystal Oscillator with Varying Vibration Frequencies," 1997

[12] Steve Fry, "Acceleration Sensitivity Characteristics of Quartz Crystal Oscillators", App Note 01.2006, Greenray Industries Inc., 2006

[13] Morley, P. E.; Haskell, R. B., "Method for measurement of the sensitivity of crystal resonators to repetitive stimuli," Frequency Control Symposium and PDA Exhibition, 2002. IEEE International, vol., no., pp. 61,65, 2002

[14] Haskell, R. B.; Morley, P. E.; Stevens, D. S., "High Q, precision SC cut resonators with low acceleration sensitivity," Frequency Control Symposium and PDA Exhibition, 2002. IEEE International, vol., no., pp. 111,118, 2002

[15] J. J. Ganepain, R. Besson, "Nonlinear effects in piezoelectric quartz crystal," Physical Acoustics, Vol XI, W.P. Mason, Ed. Academic, 1975, pp. 245-288.

[16] "VCXO Tuning Slope (Kv), Stability, and Absolute Pull Range (APR)", Silicon Laboratories Inc., AN266, Rev 0.2

[17] Walls, F. L.; Gagnepain, Jean-Jacques, "Environmental sensitivities of quartz oscillators," Ultrasonics, Ferroelectrics and Frequency Control, IEEE Transactions on, vol. 39, no. 2, pp. 241,249, March 1992

[18] "Clock Division with Jitter and Phase Noise Measurements," Silicon laboratories Inc., Rev 1.0

[19] Zhu Yonggao, "Jitter Attenuator of P16CX201A Loop filter Design," Application Note 334, Pericom Semiconductor Corp.

[20] Patent: U.S. Pat. No. 7,358,820 (B2), Nicola Da Dalt, "Method and Device for Stabilizing a Transfer Function of a Digital Phase Locked Loop," Jun. 29, 2006

What is claimed is:

1. A phase locked loop (PLL) comprising a phase frequency detector (PFD), a loop filter, and a voltage controlled oscillator (VCO), characterized in that the PLL further comprises:
   an acceleration sensor for generating an acceleration signal by detecting an acceleration of the VCO;
   a first filter for filtering a phase difference signal generated by the PFD to obtain a filtered phase difference signal;
   an adaptive compensation unit for generating a correction signal based on the acceleration signal and the filtered phase difference signal;
   a first summing unit, connected between the loop filter and the VCO, for summing up the correction signal and an oscillator control signal output from the loop filter to compensate a frequency shift of an output clock signal from the VCO caused by the acceleration of the VCO.

2. The PLL according to claim 1, wherein the adaptive compensation unit comprises:
   a cross-correlation unit for calculating a correlation coefficient between the acceleration signal and the filtered phase difference signal;
   a gain generation unit for generating a gain setting signal as a gain for the acceleration signal based on the correlation coefficient; and
   a first variable gain amplifier (VGA) for generating the correction signal by applying the gain to the acceleration signal.

3. The PLL according to claim 1, wherein the acceleration sensor comprises:
   a plurality of accelerometers, each being configured for generating an acceleration component signal by detecting an acceleration component of the VCO in one of a plurality of directions;
   a plurality of VGAs, each being connected to a respective output of the plurality of accelerometers for applying a respective weight to a corresponding acceleration component signal to get a weighted acceleration component signal; and
   a second summing unit configured for summing up the weighted acceleration component signals to form the acceleration signal.

4. The PLL according to claim 3, wherein the adaptive compensation unit further comprises:
   a de-multiplexer for forwarding the gain setting signal from the gain generation unit to a selected one of the first VGA as the gain and to the plurality of VGAs as the weights.

5. The PLL according to claim 4, wherein the weights for the plurality of VGAs are determined by:
   a) judging whether current weights are marked as calibrated;
   b) initially setting one of the gain and the weights to be a non-zero constant, and the other(s) of the gain and the weights to be zero, if it is judged that any one of the current weights is not marked as calibrated;
   c) sequentially repeating an iteration as follows on each of the VGAs of which the gain or the weight is initialized to be zero in b), until all of at least one of the gain or weights are determined:
      forwarding the gain setting signal from the gain generation unit to the selected one of the VGAs, meanwhile holding the gain or weight of each of the rest VGAs as its value being determined by the previous iteration;
      letting the PLL work for continually updating the gain or weight of the selected VGA until the gain or weight of the selected VGA is converged to a certain value which is then determined as the gain or weight of the selected VGA in the current iteration;
   d) deciding whether the at least one of the gain or weights determined in c) are converged by judging whether the variances of respective time series of the gain and weights determined by arbitrary number of recent iteration(s) performed in c) are smaller than a predetermined threshold;
   e) repeating c)-d), until it is decided that the at least one of the current determined gain or weights are converged; and
   f) marking the current determined weights as calibrated.

6. The PLL according to claim 1, wherein
   the cross-correlation unit is configured for obtaining a peak value and its position in a cross-correlation sequence calculated from sequences of the acceleration signal and the filtered phase difference signal as the correlation coefficient and a delay respectively.

7. The PLL according to claim 6, wherein the adaptive compensation unit further comprises:
   a second filter arranged between the accelerometer and the first VGA, and configured for filtering the acceleration signal from the accelerometer with its filter coefficients; and
   an equalization coefficient estimator for updating the filter coefficients of the second filter based on the delay, the acceleration signal and the filtered phase difference signal.

8. The PLL according to claim 6, wherein the adaptive compensation unit further comprises:
   a second filter arranged between the first VGA and the first summing unit, and configured for filtering the correction signal from the first VGA 464 with its filter coefficients; and
   an equalization coefficient estimator for updating the filter coefficients of the second filter based on the delay, the acceleration signal and the filtered phase difference signal.

9. A phase locked loop comprising a phase frequency detector (PFD), a loop filter, and a voltage controlled oscillator (VCO), characterized in that the PLL further comprises:
   a plurality of accelerometers, each being configured for generating an acceleration component signal by detecting an acceleration component of the VCO in one of a plurality of directions;
   a first filter configured for filtering a phase difference signal generated by the PFD to obtain a filtered phase difference signal;
   a plurality of adaptive compensation units, each being configured for generating a correction component signal based on the corresponding acceleration component signal and the filtered phase difference signal;
   a second summing unit configured for summing up the correction component signals to form a correction signal;
   a first summing unit, connected between the loop filter and the VCO, for summing up the correction signal and an oscillator control signal output from the loop filter to compensate a frequency shift of an output clock signal from the VCO caused by the acceleration of the VCO.

10. The PLL according to claim 9, wherein each of the adaptive compensation units comprises:
    a cross-correlation unit for calculating a correlation coefficient between the acceleration component signal and the filtered phase difference signal;

a gain generation unit for generating a gain setting signal as a gain for the acceleration component signal based on the correlation coefficient; and a variable gain amplifier (VGA) for generating the correction component signal by applying the gain to the acceleration component signal.

11. A method for adaptively compensating a phase locked loop (PLL), comprising:

generating an acceleration signal by detecting an acceleration of a voltage controlled oscillator VCO of the PLL;

generating a correction signal by applying a gain to the acceleration signal;

summing up the correction signal and an oscillator control signal from a loop filter of the PLL for compensating a frequency shift of an output clock signal from the VCO caused by the acceleration of the VCO.

12. The method according to claim 11, wherein the gain is obtained by steps of:

obtaining a feedback clock signal;

determining a phase difference signal between a reference clock signal and the feedback clock signal;

filtering the phase difference signal to obtain the filtered phase difference signal;

calculating a correlation coefficient of the acceleration signal and the filtered phase difference signal; and generating a gain setting signal as the gain based on the correlation coefficient.

13. The method according to claim 11, wherein generating the acceleration signal comprises:

generating a plurality of acceleration component signals, each being generated by detecting an acceleration component in each of a plurality of directions;

applying a respective weight to a corresponding acceleration component signal to get a weighted acceleration component signal; and summing up the weighted acceleration component signals to form the acceleration signal.

14. The method according to claim 13, wherein the weights are determined by:

a) judging whether current weights are marked as calibrated;

b) initially setting one of the gain and the weights to be a non-zero constant, and the other(s) of the gain and the weights to be zero, if it is judged that any one of the current weights is not marked as calibrated;

c) sequentially repeating an iteration as follows on the acceleration signal or the acceleration component signal to which the gain or the weight initialized to be zero in b) is applied, until all of at least one of the gain or weights are determined:

applying the gain setting signal to a selected one of the acceleration signal and the acceleration component signal, meanwhile holding the applied gain or weights as their values being determined by the previous iteration;

letting the PLL work for continually updating the gain applied to the selected acceleration signal or the weight applied to the selected acceleration component signal, until the gain applied to the selected acceleration signal or the weight applied to the selected acceleration component signal is converged to a certain value which is then determined as the gain applied to the selected acceleration signal or the weight applied to the selected acceleration component signal in the current iteration;

d) deciding whether the at least one of the gain or weights determined in c) are converged by judging whether the variances of the respective time series of the gain and weights determined by arbitrary number of recent iteration(s) performed in Step c) are smaller than a predetermined threshold;

e) repeating c)-d), until it is decided that the at least one of the current determined gain or weights are converged; and f) marking the current determined weights as calibrated.

15. The method according to claim 12, wherein calculating the correlation coefficient comprises:

obtaining a peak value and its position in a cross-correlation sequence calculated from sequences of the acceleration signal and the filtered phase difference signal as the correlation coefficient and a delay respectively.

16. The method according to claim 15, further comprises:

updating filter coefficients of a filter based on the delay, the acceleration signal and the filtered phase difference signal; and filtering the acceleration signal with the updated filter coefficients.

17. The method according to claim 15, further comprises:

updating filter coefficients of a filter based on the delay, the acceleration signal and the filtered phase difference signal; and filtering the correction signal with the updated filter coefficients.

* * * * *